United States Patent [19]

Otsuka et al.

[11] Patent Number: 5,402,318

[45] Date of Patent: Mar. 28, 1995

[54] SEMICONDUCTOR INTEGRATED CIRCUIT DEVICE

[75] Inventors: Kanji Otsuka, Higashiyamato; Takayuki Okinaga, Hanno; Yuji Shirai, Hamura; Takashi Miwa, Fussa; Toshihiro Tsuboi, Kodaira; Shouji Matsugami, Kokubunji, all of Japan

[73] Assignees: Hitachi, Ltd; Hitachi ULSI Engineering Corp., both of Tokyo, Japan

[21] Appl. No.: 115,611

[22] Filed: Sep. 3, 1993

[30] Foreign Application Priority Data

Sep. 7, 1992 [JP] Japan .................. 4-237942

[51] Int. Cl.⁶ .................. H01L 23/28; H05K 1/11
[52] U.S. Cl. .................. 361/794; 257/687; 257/691; 257/696; 257/700; 257/787; 361/730; 361/792; 174/52.2
[58] Field of Search .............. 361/728, 729, 601, 730, 361/752, 753, 760, 761, 792, 794; 174/52.2, 52.4, 262–263; 257/678, 684, 687, 700, 690, 691–696, 787; 437/211, 219

[56] References Cited

U.S. PATENT DOCUMENTS

| 5,008,734 | 4/1991 | Dutta et al. | 357/74 |
|---|---|---|---|
| 5,214,845 | 6/1993 | King et al. | 174/52.2 |
| 5,225,709 | 7/1993 | Nishiuma et al. | 257/700 |
| 5,227,583 | 7/1993 | Jones | 174/524 |
| 5,294,751 | 3/1994 | Kamada | 174/52.4 |

FOREIGN PATENT DOCUMENTS 164056 6/1990 Japan .
2-208947 8/1990 Japan .

OTHER PUBLICATIONS

"Noise Containment" (Chapter entitled: Package Electrical Design), *Microelectronics Packaging Handbook*, Van Nostrand Reinhold, 1989, pp. 143–147.

*Primary Examiner*—Bot Ledynh
*Attorney, Agent, or Firm*—Pennie & Edmonds

[57] ABSTRACT

A semiconductor circuit device includes a multi-layered substrate comprising a plurality of signal lines sandwiched between a power source line and a ground line, with insulation layers formed therebetween to reduce fluctuation of a ground line potential at the time of simultaneous switching of the signal lines and to increase the operational speed. The signal lines provides bidirectional current paths and is disposed between the current source line and the ground line. The multi-layered substrate is formed around a semiconductor pellet. Electrode pads are formed on the insulation layer over the ground line on the same level as the signal lines and generally on the same level as the main surface of the semiconductor pellet where electrodes pads are formed. Bonding wires are used to electrically connect the electrode pads on the pellet and the electrodes formed on the insulation layer. Additional bonding wires are used to electrically connect the electrode pads formed on the insulation layer and electrode pads formed on the power source line which is at a higher level and further away from the electrode pads formed on the insulation layer. Some of the electrode pads formed on the insulation layer is directly connected to the ground line using a side plate extension.

8 Claims, 9 Drawing Sheets

CURRENT DISTRIBUTION IN GROUND
⊗ GOING CURRENT FLUX
⊙ RETURNING CURRENT FLUX

FIG. 3

← SIGNAL CURRENT
----→ GROUND CURRENT

FIG. 4

→ ←  } CURRENT LOOP WHEN LSI DRIVER SIGNAL IS ON

--→ ←-- } CURRENT LOOP WHEN LSI DRIVER SIGNAL IS OFF

SEMICONDUCTOR INTEGRATED CIRCUIT DEVICE

BACKGROUND OF THE INVENTION

This invention relates to technology which will be effective when applied to a semiconductor integrated circuit device which is a resin-mold package such as a QFP (Quad Flat Package), a SOP (Small Out-line Package), or a ZIP (Zigzag In-line Package), and which has a plurality of driving circuits (hereinafter referred to as "drivers").

A conventional semiconductor integrated circuit device is, for example, a resin mold package having a structure such as a QFP, a SOP, or a ZIP. Such a semiconductor integrated circuit device having a plurality of drivers includes a signal transmission side semiconductor integrated circuit LSI 100 and a signal reception side semiconductor integrated circuit device LSI 200 that are connected with intra-package transmission lines 300 (hereinafter referred to as an "interposer") as shown in FIG. 17.

Figure 17:
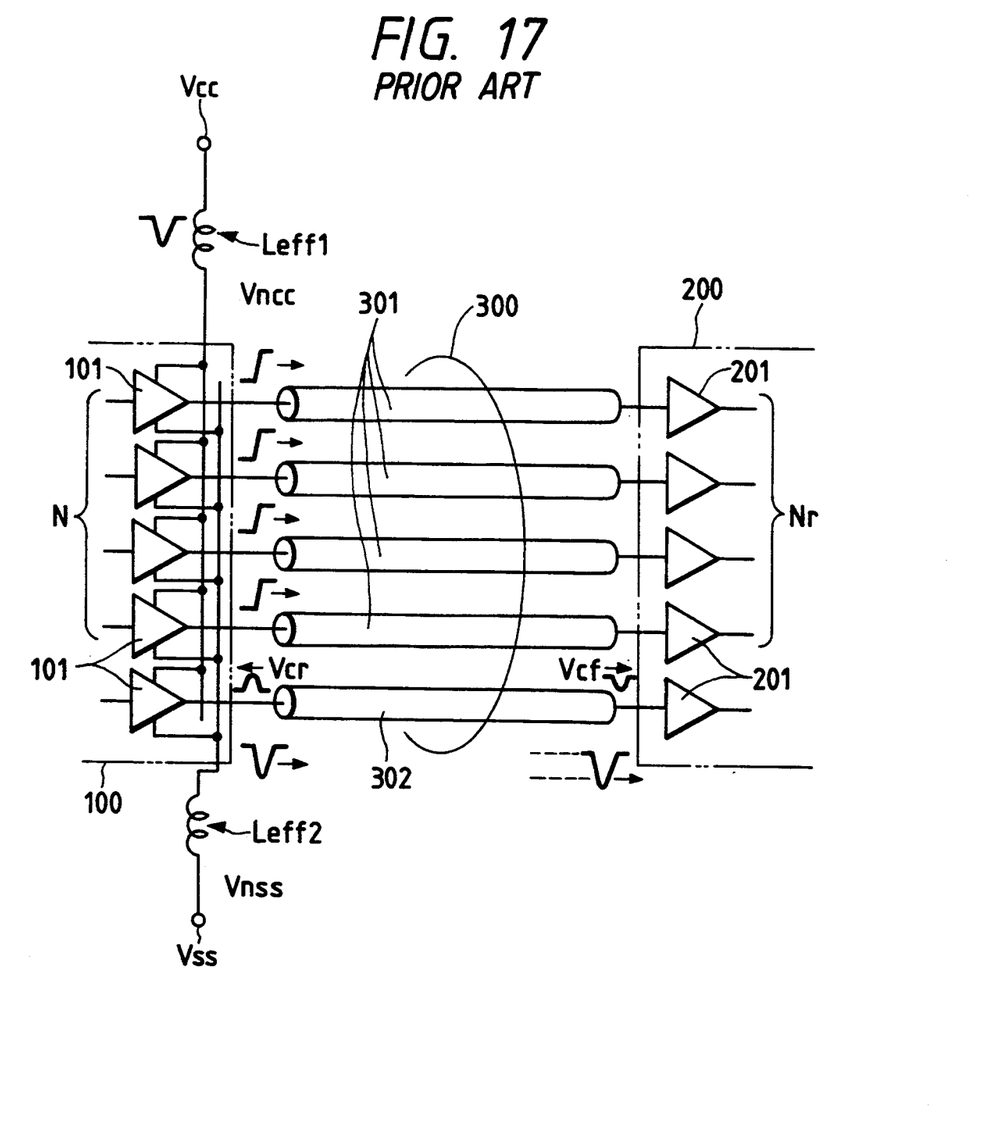
FIG. 17 is an explanatory circuit diagram showing a resin mold semiconductor device employing a QFP structure and for explaining the prior art.

In FIG. 17, reference numeral 101 represents a buffer of the transmission end LSI 100; 201 is a buffer of the reception end LSI 200; 301 is a driving-system signal line in the interposer 300, for example, a signal line for supplying clock signals; and 302 is a stationary-system signal line in the interposer 300, for example, a signal line for supplying pulse signals. Symbol Vcc represents a power source line (power source voltage line inside a chip: e.g., a circuit operating voltage of 5 V); Vss is a ground line (reference potential line inside the chip: e.g., a circuit ground potential of 0 V); Leff1 is an effective inductance on the power source Vcc side; Leff2 is an effective inductance on the power source Vss side; Vncc is a voltage drop (noise) due to the effective inductance Leff1 on the power source Vcc side effective inductance Leff1; Vnss is a voltage drop (noise) due to the effective inductance Leff2 on the power source Vss side; Vcr is a backward noise; Vcf is a forward noise; N is the number of driving-system signal lines 301 which are simultaneously switched; and Nr is the number of driving reception ends.

In FIG. 17, when four buffers 101 of the transmission end LSI 100 are simultaneously switched, a step voltage is applied to each of the four driving-system signal lines 301 of the intra-package transmission lines, and four buffers 201 of the reception end LSI 200 are driven.

To generate the step voltage at this time, a current change of di/dt per signal line occurs in the power source line Vcc. Since the N (N=4) driving-system signal lines 301 are simultaneously changed, the change is expressed by N×di/dt. The greater the number N, the greater becomes the current change. A voltage drop (noise) of Vnss=Leff1×N×di/dt occurs in the power source line Vcc due to the effective inductance Leff1 of all the lines through which the current of the power source line Vcc flows. This drop is also transmitted to the stationary-system signal line 302, and a cross-talk noise of the backward noise Vcr and the forward noise Vcf is superposed. Since the resultant noise exceeds the noise margin, an erroneous operation occurs in the stationary-system reception end LSI 200 or in the transmission end LSI 100.

Accordingly, the signal current becomes the current of the ground line Vss at the time of the drop of the step voltage, and the problem of the effective inductance Leff2 occurs. To reduce the voltage drops Vncc and Vnss irrespective of the increase of di/dt resulting from the increase of the number N and the higher operational speed, there is no way but to reduce the effective inductances Leff1 and Leff2. (Refer to "Microelectronics Packaging Handbook", VAN NOSTRAND REINHOLD, 1989, pp. 143–147.)

Figure 18:
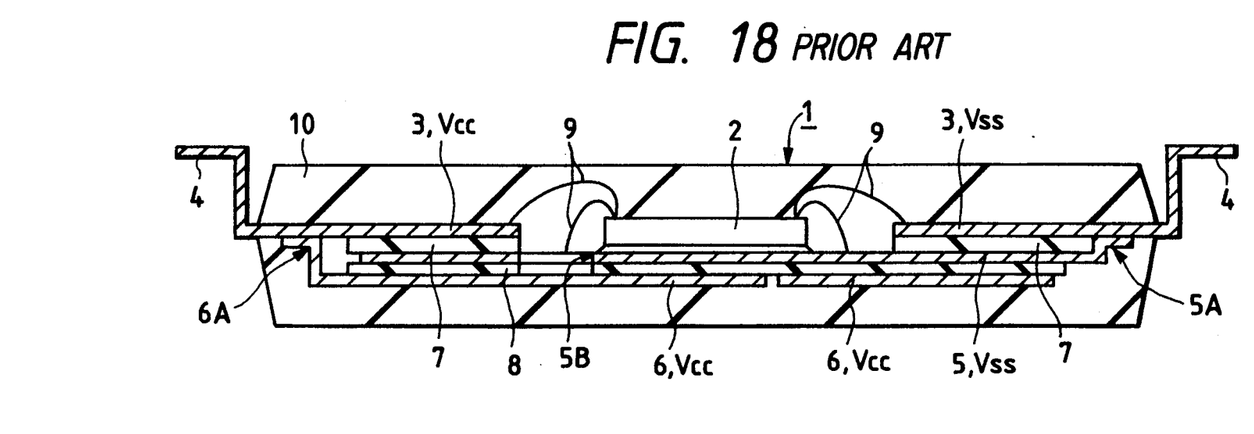
FIG. 18 is a sectional view showing a resin mold semiconductor device employing the QFP structure and for explaining the prior art.

Consequently, for example, auxiliary electrode plate (for the power source Vss or the power source line Vcc) is disposed at opposed positions of the back of the semiconductor chip 2 and the inner lead 3 as shown in FIG. 18, so as to cut off a part of the electric field generated between the inner leads 3 by the auxiliary electrode plate (for the power source Vss or for the power source line Vcc) 5 and to reduce a stray capacitance added between the inner leads 3. In such a way, the cross-talk is reduced and the operation speed is increased.

Figure 19:
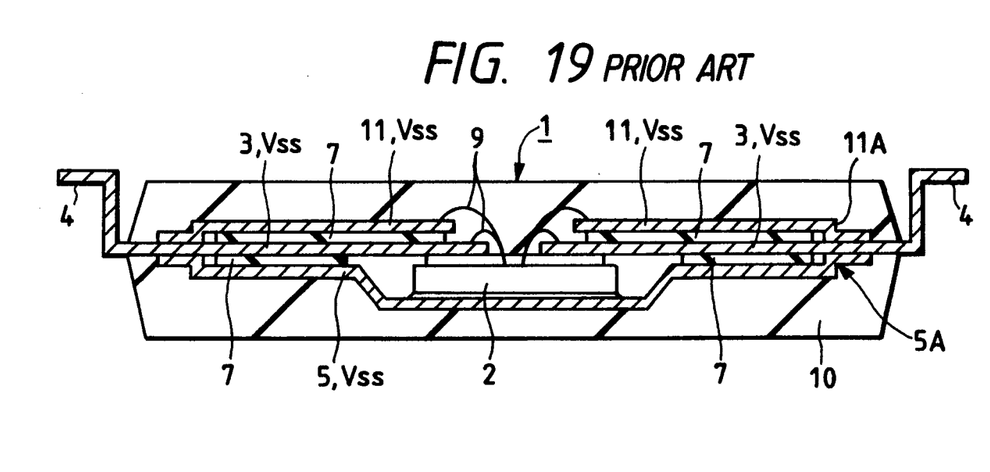
FIG. 19 is a sectional view showing another resin mold semiconductor device employing the QFP structure and for explaining the prior art.

Further, an auxiliary electrode plate 11 is disposed on the inner lead 3 through an insulating layer 7 as shown in FIG. 19. One of the ends of this auxiliary electrode plate 11 on the semiconductor chip 2 side is connected to the external terminal of the semiconductor chip 2 for the power source Vss (or for the power source Vcc) and the rear end of the auxiliary electrode plate 11 on the outer lead 4 side is connected to the rear end of the inner lead 3 for the power source Vss (or for the power source Vcc), so that the inductance component can further be reduced by the auxiliary electrode plate 11 and the operation speed can be increased (Japanese Patent Laid-Open No. 164056/1990).

In FIGS. 18 and 19, reference numeral 1 represents the resin mold semiconductor device; 2 is the semiconductor chip; 3 is the inner lead; 4 is the outer lead; 5, 6 and 11 are auxiliary electrode plate; 7 and 8 are the insulating layer; 9 is the bonding wire; 10 is the resin mold portion; 5A and 6A are connection portion; and 5B is a through-hole.

SUMMARY OF THE INVENTION

As a result of studies of the prior art described above, the inventor of the present invention has found out the following problems.

When a large number of driving-system signal lines, for example, N driving-system signal lines are simultaneously switched at a certain clock timing, the current is flowing at the time of ON of the power source line Vcc (the current supplied from the power source line Vcc) is given by Is=N×di/dt.

The current Ig supplied to the ground line Vss (the power source Vss) when the power source line Vcc is turned OFF is similarly given by Ig=N×di/dt.

The voltage at the input port of the ground line Vss to an LSI involves a voltage drop (or a voltage rise) due to the effective inductance Leff2 of the ground line Vss. This voltage drop (or the voltage rise) is given by Vnss=Leff2×N×di/dt.

As described above, when a large number of driving-system signal lines, for example, N driving-system signal lines are simultaneously switched at a certain clock timing, the potential of the ground line Vss fluctuates due to the voltage drop (or the voltage rise) of the power source Vss due to the effective inductance Leff2, causing an erroneous operation.

It is therefore an object of the present invention to provide a technique by which fluctuation of the potential of the ground line Vss on simultaneous switching of a plurality of signal lines can be reduced.

It is another object of the present invention to provide a technique by which the operation speed can be increased.

It is still another object of the present invention to provide a technique by which the number of leads of the ground line Vss can be reduced.

The above and other objects and novel features of the present invention will become more apparent from the following description taken in conjunction with the accompanying drawings.

The following will briefly represent the present invention disclosed herein.

(1) A semiconductor integrated device includes a plurality of signal lines, a power source line and a ground line, and has a circuit construction in which a plurality of signal lines serve as bidirectional current paths, where each signal line is disposed between the power source line and the ground line, and each has a multilayer structure.

(2) The line width of the power source line and that of the ground line is equal to or greater than the line widths of the signal lines.

(3) The whole line of at least one of the power source line and the ground line is shared in common on a planar layer.

(4) A semiconductor integrated circuit device includes a plurality of signal lines, a power source line and a ground line and having a circuit construction in which a plurality of signal lines serve as bidirectional current paths, where the signal lines, the power source line and the ground line are combined in a multi-stage multi-layered structure in such a manner that each signal line is disposed between the power source line and the ground line.

(5) The semiconductor integrated circuit device is at least one of a logical integrated circuit device of CMOS, a memory integrated circuit device of CMOS and a microcomputer of CMOS.

(6) A semiconductor integrated circuit device comprises a semiconductor pellet having a plurality of first, second and third bonding pads on one of the main faces thereof. An insulating multi-layered substrate including a first reference potential layer (power source potential wiring layer) is formed on a first plane thereof substantially parallel to the main face of the semiconductor pellet and serves to supply a reference potential to the semiconductor pellet. A second reference potential layer (ground potential wiring layer) is formed on a second plane thereof facing the first plane and substantially parallel to the main face of the semiconductor pellet. A plurality of signal wiring layers as inner layers of the multilayered substrate are sandwiched between the first and second reference potential layers, and so spaced by predetermined distances from the first and second reference potential layers, respectively, the signal wiring layers being a circuit construction as bidirectional current paths. Wires for electrically connect the first bonding pads to the first reference potential layer, the second bonding pads to the signal wiring layer and the third bonding pads to the second reference potential layer, respectively. A plurality of external extension leads electrically connect to the first reference potential layer, to the second potential layer and to the signal wiring layer, respectively. A resin molding body seals the semiconductor pellet, the multi-layered substrate and the wires are sealed.

(7) A semiconductor integrated circuit device comprises a semiconductor pellet having a plurality of first, second and third bonding pads on one of the main faces thereof, which is supported on a base substrate. An insulating multi-layered substrate is formed to the base substrate, including a first reference potential layer (power source potential wiring layer) formed on a first main face thereof substantially parallel to the main face of the semiconductor pellet and serving to supply a reference potential to the semiconductor pellet, and a second reference potential layer (ground wiring layer) formed on a second plane thereof facing the first plane and on the side surfaces thereof extending between the first and second planes. A plurality of signal wiring layers as the inner layers of the multi-layered substrate are sandwiched between the first and second reference potential layers, and so spaced by predetermined distances from the first and second reference potential layers, respectively, the signal wiring layers being a circuit construction as a bidirectional current path. Wires electrically connected the first bonding pads to the first reference potential layer, the second bonding pads to the signal wiring layer and the third bonding pads to the second reference potential layer, respectively. A plurality of external extension leads electrically connect to the first reference potential layer, to the second reference potential layer, and to the signal wiring layer, respectively; and a resin molding body in which the semiconductor pellet, the multi-layered substrate and the wires are sealed.

By using the semiconductor integrated device described above in (1), when the power source line Vcc is on (the switch SW1 is on and the switch SW2 is off) the current is supplied from the power source line Vcc (the current flowing through the power source) flows in the direction indicated by the arrow of a solid line and a voltage drop Vncc due to an effective inductance Leff1 of the power source line Lc is Leff1×di/dt.

When the power source line Vcc is off (the switch SW1 is off and the switch SW2 is on), the current Ig supplied to the ground line Vss flows in the direction indicated by the arrow of a dotted line.

The voltage of the ground line Vss at the inlet port to the LSI involves a voltage drop (or a voltage rise) due to the effective inductance Leff2 of the power source line Ls. This voltage drop (or the voltage rise) Vnss (or Vnss) is Vnss=Leff2×di/dt.

Figure 1:
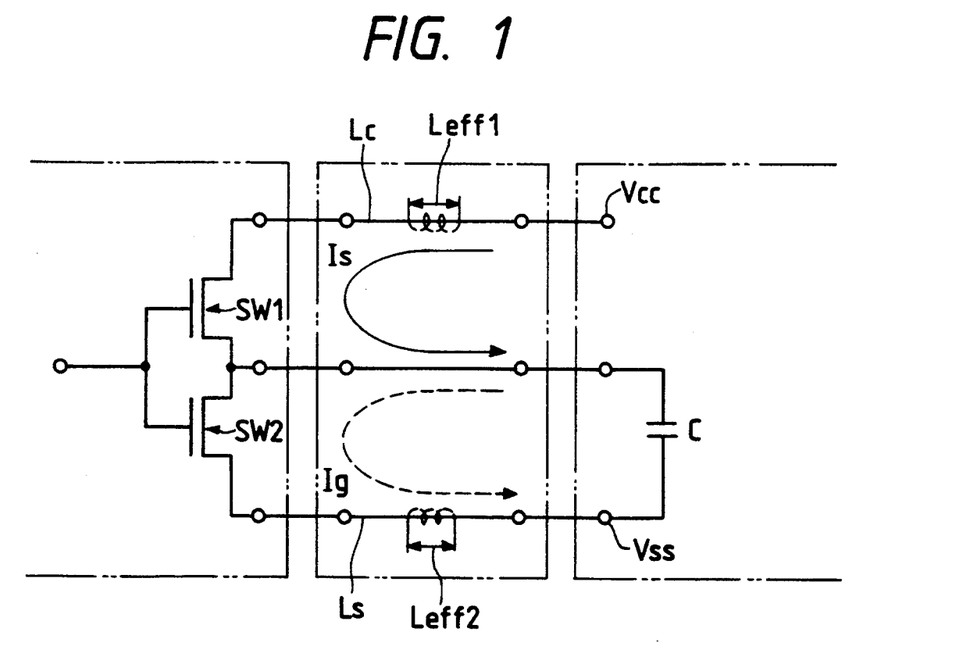
FIG. 1 is an equivalent circuit diagram for explaining the principle of the present invention.
Figures 2A, 2B:
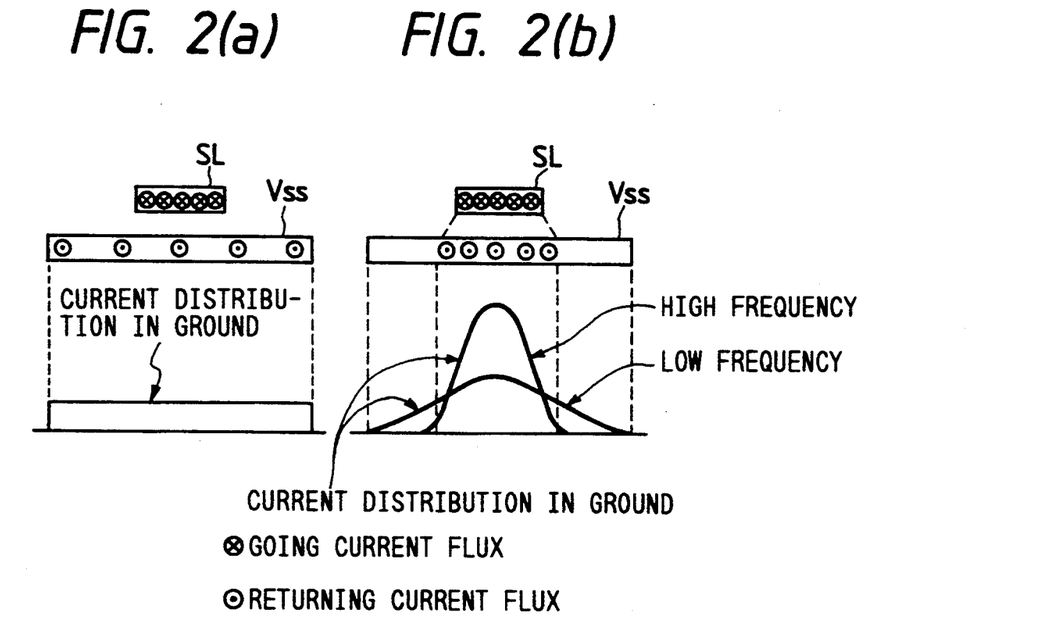

Now, the effective inductance Leff will be explained. FIGS. 2(a) and 2(b) are sectional views of a microstrip line, and it is assumed that a current flux flowing to the depth (perpendicular to the paper) of a driving-system signal line SL. FIG. 2(a) is in the case of D.C. and FIG. 2(b) in the case of A.C.

In the case of D.C., the returning current of the ground line Vss is fully distributed throughout the entire width of the ground line Vss as shown in FIG. 2(a). In the case of A.C., a current flux moves, tending to prevent as much as possible the change of the magnetic flux due to the change of di/dt as shown in (b). The closer the going and returning currents to each other, the stronger their effect of offsetting the magnetic fields and the easier becomes the control of the change of di/dt. As a result, though the ground line Vss has a great width, the returning current concentratedly flows immediately below the driving signal line as shown by the current distribution in FIG. 2(b). The higher the frequency, the more remarkable becomes this tendency. This can be expressed by equations below:

$$Leff1 = Lsd + Lss - Mds \tag{1}$$

$$Leff2 = Lse + Lss - Mes \tag{2}$$

In equations (1) and (2) given above, paths (passages) are represented by suffixes when the power source line Vcc is d, the signal by s and the ground line Vss by e. Symbols L and M represent self inductance and mutual inductance, respectively.

In the case of the power supply line Vcc and the ground line Vss of the flat surface, Lsd and Lse are considered to be $Lsd = Lse \approx 0$. When the current concentrates as shown in FIG. 2, they become substantially equal to the inductance of the signal. It can thus be understood that the effective inductance Leff can be made small only when the mutual inductance M is increased.

Figure 3:
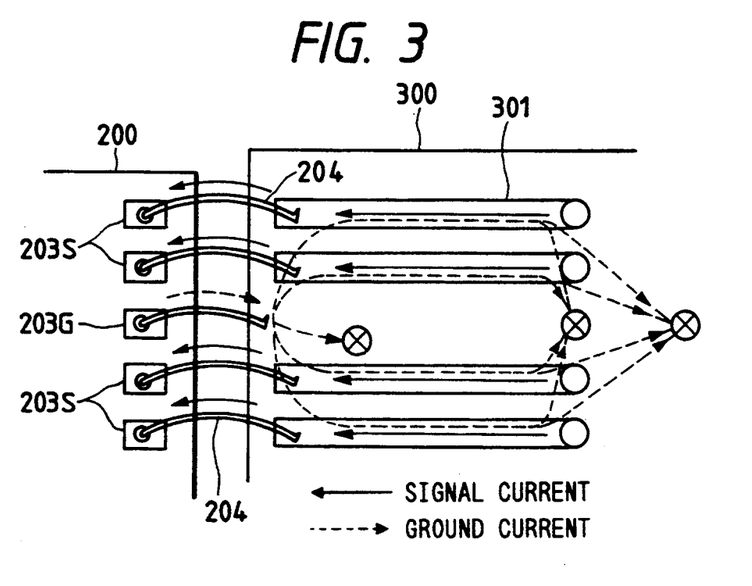
FIG. 3 is a schematic view showing currents flowing through wirings inside a package for explaining the principle of the present invention.

FIG. 3 illustrates how current flows in a practical package. In FIG. 3, reference numeral 203S represents a signal pad, 203G represents a pad for the power source Vss, and 204 represents bonding wires.

Figure 4:
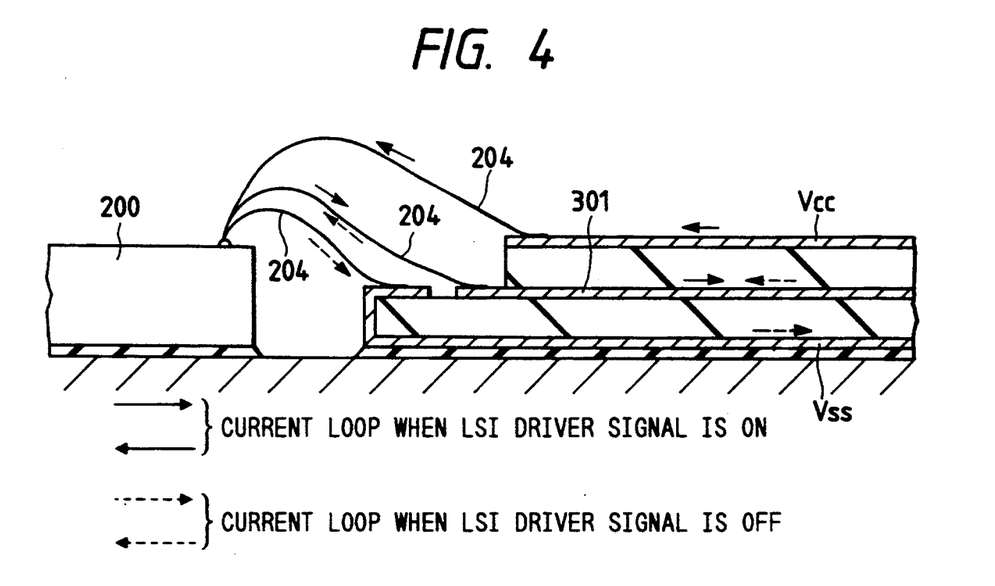
FIG. 4 is a section for explaining the basic structure of the present invention.

FIG. 3 shows an example where three connecting points (sink points) exist between the ground line Vss (hereinafter simply referred to as the "ground") and the printed board. When the four signal lines change from the ON state to the OFF state, the quantity of electricity charged to the input side returns to an output driver ODC in the form of current, and flows out to the ground Vss through the NMOS of the output driver ODC as shown in FIG. 4 (basic structural diagram of the present invention) and FIG. 5 (equivalent circuit diagram of current transmission of FIG. 4). It seems natural for the current to flow into the point which is the nearest to the LSI 200 among the three ground sink points shown in FIG. 3. This holds true in the case of the D.C.

In the case of A.C. the concentration of the returning current, caused by the influence of the magnetic field generated by the current of the signal line, on the ground Vss immediately below the signal line causes the line of magnetic forces to close, and forms a current loop having a smaller energy loss. The small energy loss means that the loop has the smallest apparent inductance. The ground Vss is a flat layer wiring, and the current can take a free path. In other words, it takes the loop having the minimum energy loss. This is shown by the current flowing towards two sinks on the right side in FIG. 3. It is automatically divided below the four signals and flows towards the sinks. The flat layer wiring has a great advantage in that it can automatically control this phenomenon. As shown in FIG. 4, when the current source line Vcc is provided in the form of a flat layer wiring adjacent to the signal and forms a current loop from the power source line Vcc to the signal line, the same effect as that of the ground can be obtained.

Figure 5:
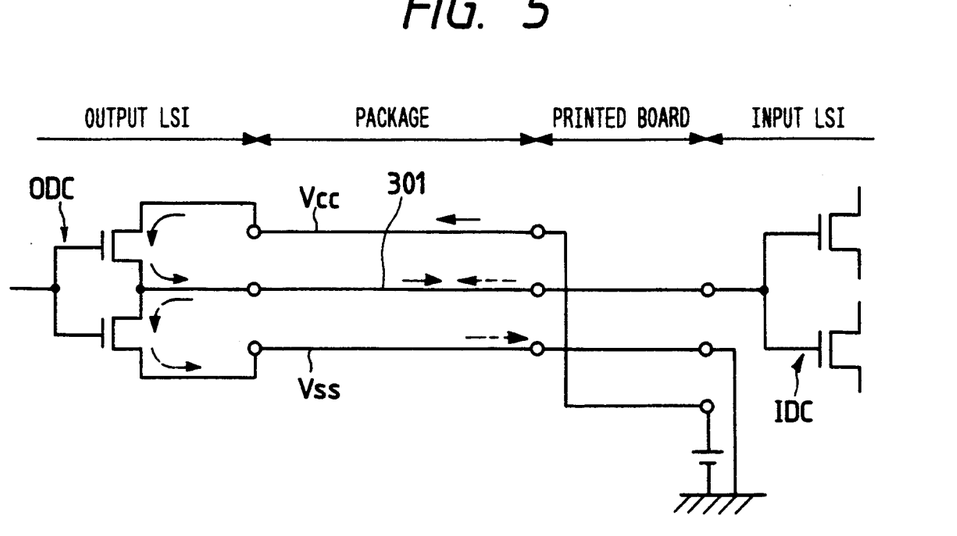
FIG. 5 is an equivalent circuit diagram of FIG. 4.

The inductance Ls becomes minimal in the case of D.C. (the shortest route), in the case of A.C. The present invention employs a wiring structure forming routes having the following relations:

$$Leff1 = Lsd + Lss - 2Mds \tag{3}$$

$$Leff2 = Lse + Lss - 2Mes \tag{4}$$

that is, the arrangement where the power source lines Vcc and the ground Vss are disposed above and below the signal line 301, respectively, as shown in FIG. 5. Such an arrangement can reduce fluctuation of the potential of the ground Vss when a plurality of signal lines are simultaneously switched. Furthermore, the operation speed can be increased and the number of leads of the ground Vss can be reduced.

BRIEF DESCRIPTION OF THE DRAWINGS

FIGS. 2(a) and 5(b) are current distribution diagrams of a microstrip line for explaining the principle of the present invention;

DESCRIPTION OF THE PREFERRED EMBODIMENTS

Hereinafter, preferred embodiments of the present invention will be described in detail with reference to the accompanying drawings.

Like reference numerals will be used throughout the drawings to represent those constituent elements which have the same function, and repetition of their explanation will be omitted.

[Embodiment 1]

Figure 6:
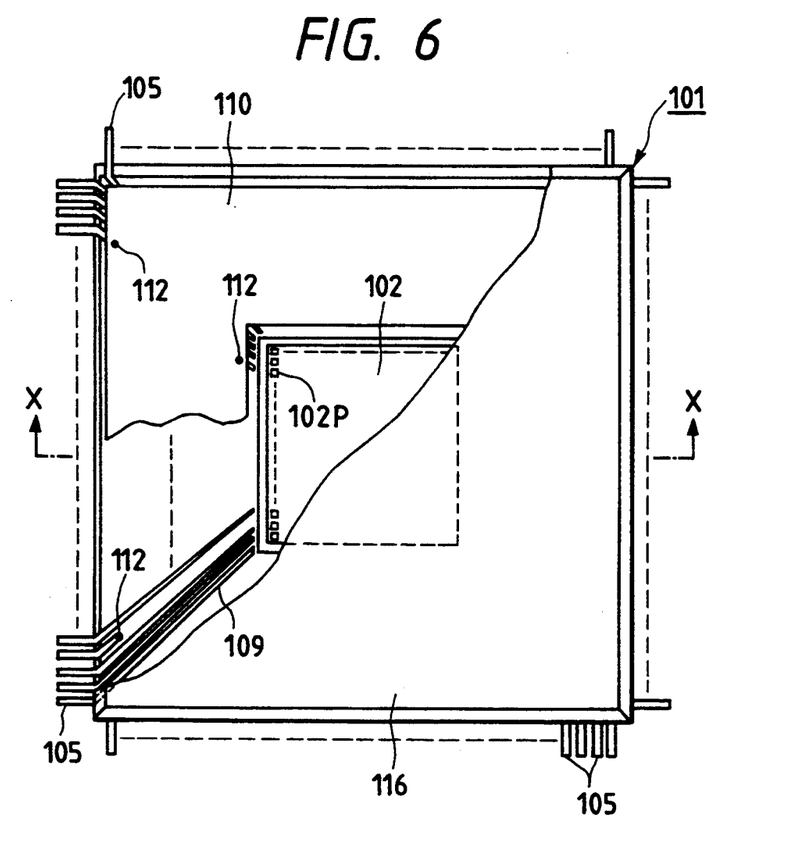
FIG. 6 is a partially cut-away plan view showing a resin mold semiconductor device employing a QFP structure of embodiment according to the present invention.
Figure 7:
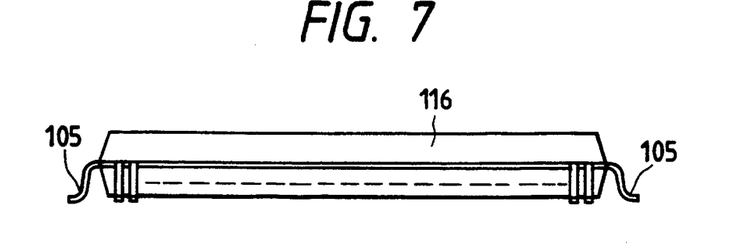
FIG. 7 is a side view of FIG. 6.
Figure 8:
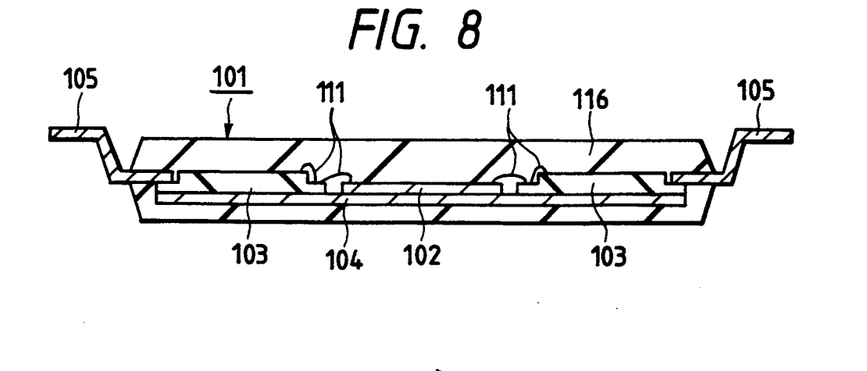
FIG. 8 is a sectional view taken along a line X—X of FIG. 6.
Figure 9:
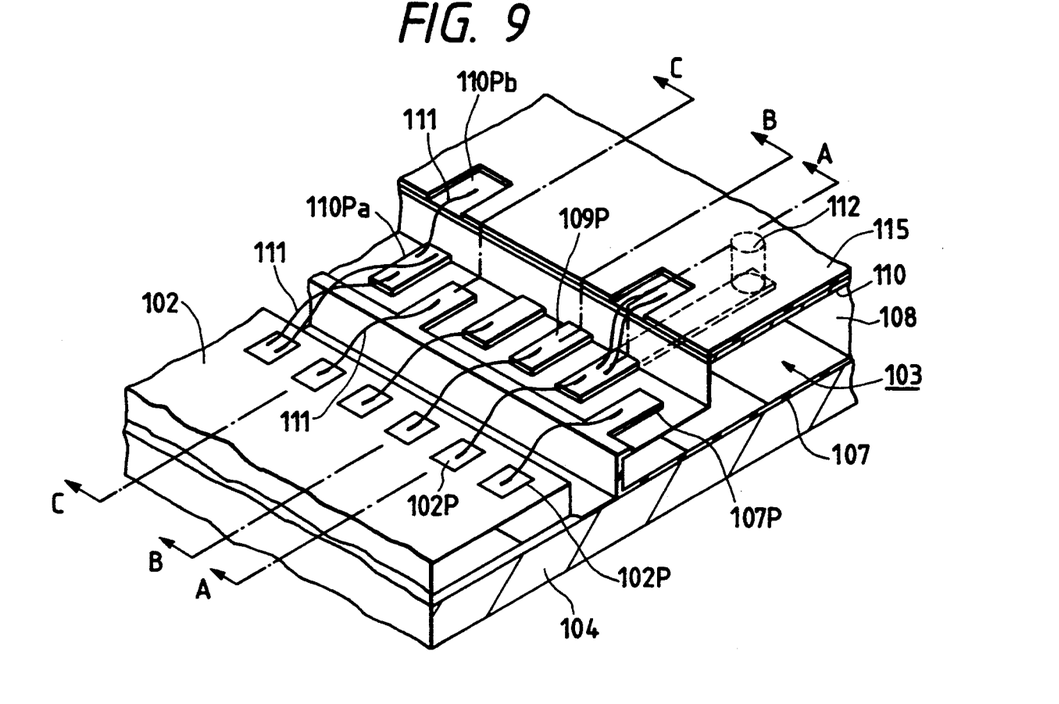
FIG. 9 is an enlarged perspective view for explaining the construction between the semiconductor chip shown in FIG. 8 and an interposer.
Figure 10:
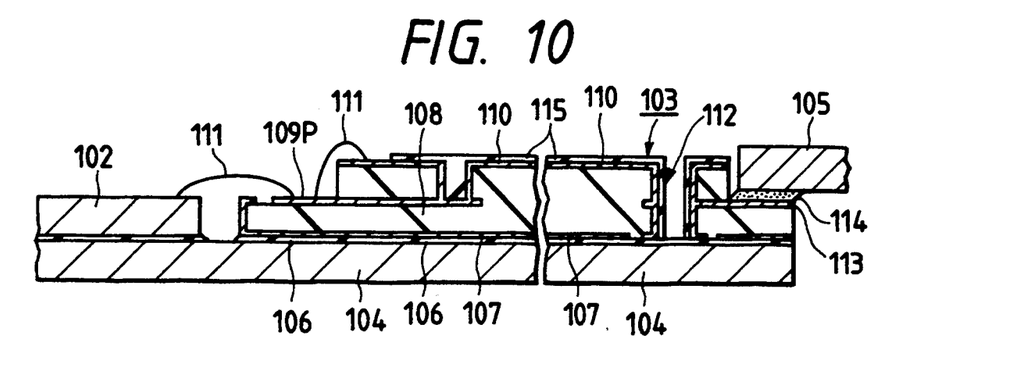
FIG. 10 is a sectional view taken along a line A—A of FIG. 9.
Figure 11:
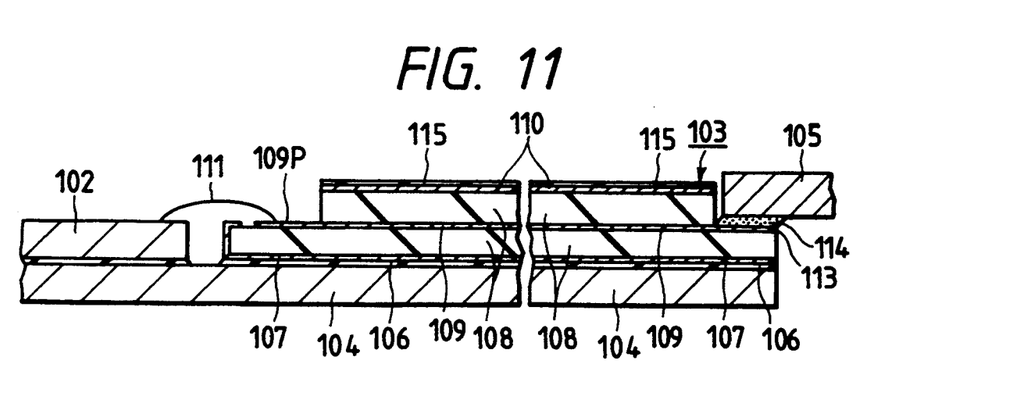
FIG. 11 is a sectional view taken along a line B—B of FIG. 9.
Figure 12:
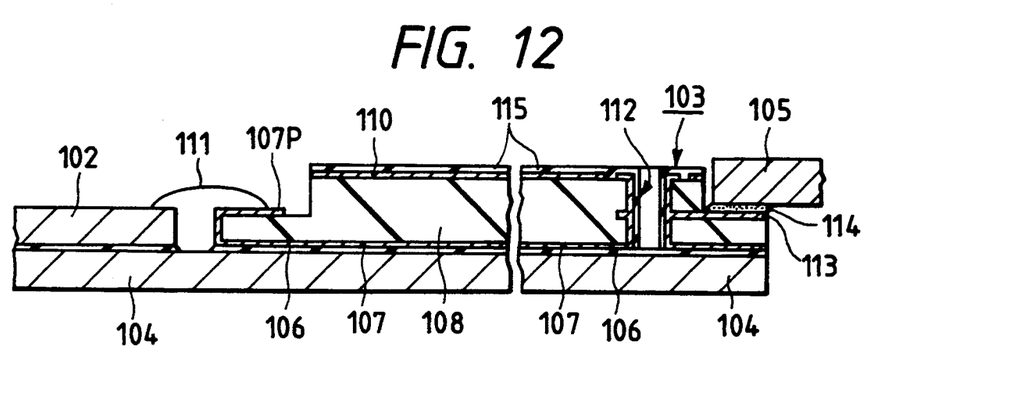
FIG. 12 is a sectional view taken along a line C—C of FIG. 9.

FIG. 6 is a partially cut-away plan view showing the structure of a resin mold semiconductor device employing a QFP structure of the Embodiment 1 according to the present invention, FIG. 7 is a side view of FIG. 6, FIG. 8 is a sectional view taken along a line X—X of FIG. 6, FIG. 9 is an enlarged perspective view for explaining the structure of connecting portions between the semiconductor chip shown in FIG. 8 and an interposer, FIG. 10 is a sectional view taken along a line A-A of FIG. 9, FIG. 11 is a sectional view taken along a line B—B of FIG. 9, and FIG. 12 is a sectional view taken along a line C—C of FIG. 9.

As shown in FIGS. 6 to 12, in the resin mold semiconductor device 101 of Embodiment 1, a semiconductor chip 102 is disposed in a region defined by one of the ends of the interposer 103 on the chip 102 side. This resin mold semiconductor device 101 has a QFP structure. The semiconductor chip 102 and the interposer 103 are mounted on the central portion of the surface of a support (for example, a Cu plate heat dissipation) 104 through an adhesive layer (e.g., Ag paste or Au—Si eutectic alloy) applied to their back, respectively.

The semiconductor chip 102 is made of single crystal silicon having a rectangular shape in plan view, for example. A predetermined circuit comprising a plurality of semiconductor devices is mounted on the surface of the semiconductor chip 102.

The distal ends of the interposers 103 face respective sides of the semiconductor chip 102. The rear ends (proximal ends) of the interposers 103 are connected to leads 105 extending radially in four directions with the semiconductor chip 102 being the center.

The resin mold semiconductor device 101 of this embodiment has a four-directional lead structure, though the structure is not particularly limited to this. (For example, a two-directional lead structure may be employed.) The lead 105 is made of, for example, an Fe—Ni alloy, a Cu alloy, oxygen-free copper (OFC), and has a thickness of about 100 to 300 μm. To improve electrical characteristics, the surface of the Fe—Ni alloy may be partially cladded with, for example, copper, at an inner lead portion of the lead 105.

As shown in FIGS. 8 to 12, the interposer 103 includes a flat sheet-like ground wire 107 which is bonded to the support plate 104 with an insulating adhesive 106 such as an epoxy adhesive. Signal lines 109 are disposed on the ground wire 107 through an insulating film 108 made of a glass fiber-reinforced resin or a polyimide tape. A flat sheet-like power source line (Vcc) 110 is disposed on these signal lines 109 through in insulating film 108, and a protective film 115 is deposited on the power source line 110.

The semiconductor chip 102 are electrically connected to the ends of the interposer 103 in the following way. As shown in FIG. 9, electrode pads 102P of the semiconductor chip 102 are electrically connected to electrode pads 107P of the ground wire 107, electrode pads 109P of the signal lines 109 and first and second electrode pads 110Pa, 110Pb of the power source lines 110 with bonding wires 111.

The bonding wires 111 are Au wires, though this is not particularly limitative. The bonding wire 111 is connected by ball bonding or wedge bonding, though this method is not particularly limitative.

As to the power source line 110, the inner lead of the lead 105 is electrically connected to an electrode pad 113 integrally formed with a throughhole (via hole) 112 for connecting the power source, with a bonding material 114 such as solder or brazing material, as shown in FIG. 10.

As to the signal line 109, the inner lead of the lead 105 is electrically connected to the electrode pad 113 of the signal line 109, formed integrally with the through-hole 112 for connecting the power source, with a bonding material 114 such as solder or brazing material, as shown in FIG. 11.

As to the ground line 107, the inner lead of the lead 105 is electrically connected to the electrode pad 113, formed integrally with the through-hole 112 for connecting the power source, with a bonding material 114 such as solder or brazing material, as shown in FIG. 12.

The whole circuit of the semiconductor device is molded and sealed with a molding resin 116.

In such a resin mold semiconductor device 101 described above, a power source line (power source Vcc) 110 and a ground line (power source Vss) 107 are disposed above and below the signal line 109 respectively as shown in FIGS. 9 to 12, and this arrangement can reduce fluctuation of the potential of the ground line occurring due to simultaneous switching of a plurality of signal lines 109. Furthermore, the operation speed can be increased and the number of leads of the ground line 107 can be reduced.

[Embodiment 2]

Figure 13:
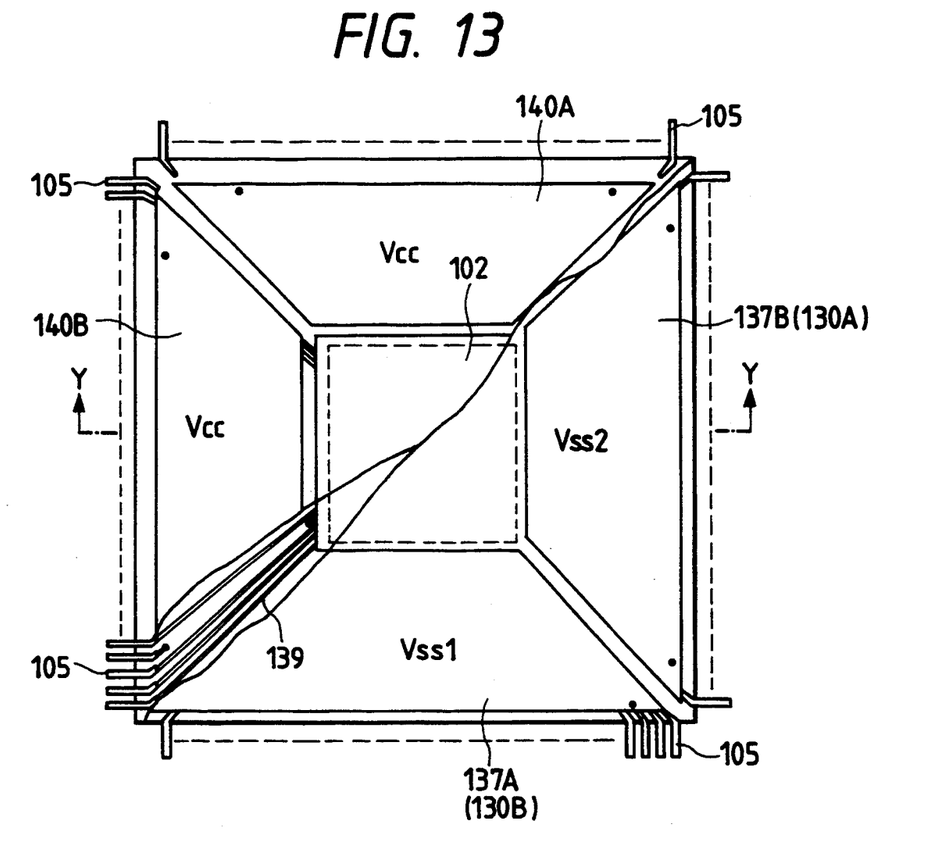
FIG. 13 is a partially cut-away plan view for explaining the structure of a resin mold semiconductor device of embodiment 2 according to the present invention.
Figure 14:
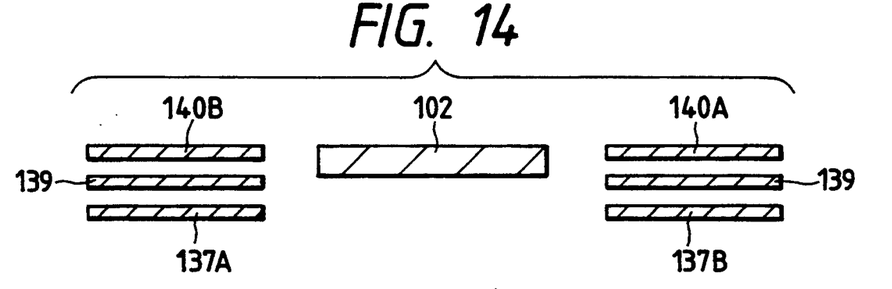
FIG. 14 is a schematic sectional view taken along a line Y—Y of FIG. 13.

FIG. 13 is a plan view showing the portion of the resin mold semiconductor device of Embodiment 2 of the present invention, from which only the mold resin is removed, and the portion from which the power source line and the signal line are further removed. FIG. 14 is a sectional view taken along a line Y—Y of FIG. 13.

In the resin mold semiconductor device of Embodiment 2 of the present invention, the interposer 103 of the first Embodiment 1 is divided into two sets of interposers 130A and interposers 130B as shown in FIGS. 13 and 14.

First and second ground lines 137A, 137B of the interposers 130A, 130B which are divided by a flat sheet-like diagonal are bonded to the support plate 104 of the Embodiment 1 with insulating adhesive 106 such as an epoxy resin. A signal line 139 is disposed on the ground lines 137A, 137B through an insulating layer 108 made of glass fiber-reinforced resin or consisting of polyimide tape. First and second power source lines 140A, 140B divided mutually into two by the flat sheet-like diagonal are disposed on this signal line 139 through the insulating layer 8, and a protective layer 115 is further disposed on the power source lines 140A, 140B.

Electrical connection of the semiconductor chip 102 to the ends of the interposers 130A, 130B is established in the same way as in FIG. 10 by connecting the electrode pads 102P of the semiconductor chip 102 to the electrode pad 107P of the first ground line 137A, the electrode pads 107P of the first ground line 137B, the electrode pads 109P of the signal line 139, the first and second electrode pads 110Pa, 110Pb of the first power source line 140A and the first and second electrode pads 110Pa, 110Pb2 of the second power source line 140B with bonding wires 111.

This arrangement can reduce the stress acting on the ground lines 137A, 137B and the power source lines 140A, 140B.

Though the ground lines and the power source lines are divided into two parts, respectively, in this Embodiment 2, they may be divided into four parts whenever necessary, in the present invention.

[Embodiment 3]

Figure 15A:
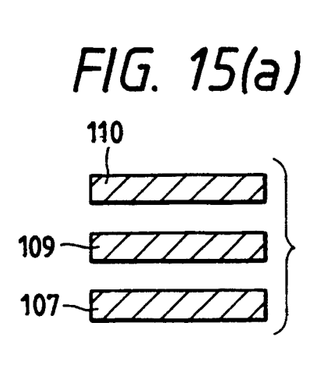
FIGS. 15(a)–15(c) sectional views for explaining the structure of principal portions of a resin mold semiconductor device of embodiment 3 according to the present invention.
Figure 15B:
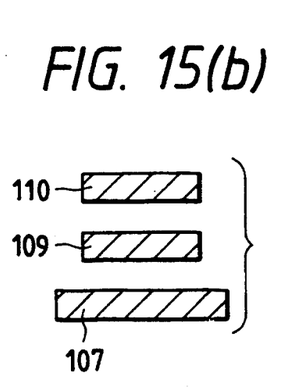
Figure 15C:
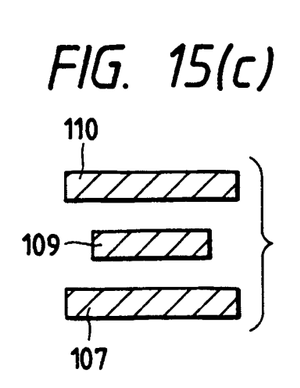

FIG. 15 is a sectional view for explaining the structure of the principal portions of a resin mold semiconductor device of Embodiment 3 according to the present invention.

In the resin mold semiconductor device of Embodiment 3 as shown in FIG. 15(a), the line width of the ground line 107, the line widths of the signal lines 109 and the line width of the power source line 110 are made equal to one another in the interposer of Embodiment 1 shown in FIGS. 6 to 13, and they are accurately arranged and formed in multilayer so that their line widths are in conformity with one another.

To further effect the technical concept of the present invention, the lines can be arranged so that the line widths of the signal lines 109 are made equal to that of the power source line 110, the line width of the ground line 107 greater than those of the signal lines 109 and the power source line 110, and the line widths of the signal lines 109 and the line width of the power source line 110 are made equal to or smaller than the line width of the ground line 107, as shown in FIG. 15(b).

To further effect the technical concept of the present invention, the lines can be arranged so that the line width of the ground line 107 and the line width of the power source line 110 are made greater than the line widths of the signal lines 109, and the line widths of the signal lines 109 are made equal to or smaller than the line with of the ground line 107 and the line width of the power source line 110, as shown in FIG. 15(c). Embodiment 1 wherein the line width of the ground line 107 and the line width of the power source line 110 are made large and they are formed in one planar layer is the most preferable one of the present invention.

[Embodiment 4]

Figure 16:
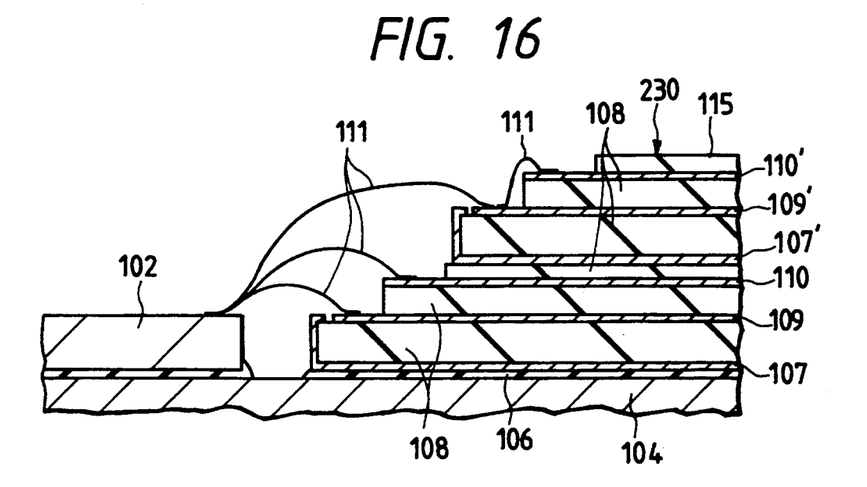
FIG. 16 is a sectional view for explaining the structure of principal portions of embodiment 4 according to the present invention.

FIG. 16 is a sectional view for explaining the structure of the principal portions of Embodiment 4 of the present invention.

As shown in FIG. 16, the resin mold semiconductor device according to Embodiment 4 of the present invention is a multi-stage multi-layered interposer 230 using two interposers 3 of Embodiment 1. In FIG. 16, reference numeral 107' represents the second layer ground line, 109' is the second layer signal line and 110' is the second layer power source line.

This multi-stage multi-layered interposer 230 can reduce the size of the package, and a multi-pin structure can be employed.

Though the present invention has thus been definitely exemplified by the embodiments thereof, the invention is in no way limited thereto, but can of course be changed or modified in various ways without departing from the scope thereof.

The typical effects brought forth by the typical invention among those described herein will be briefly described as follows.

First, fluctuation of the potential of the ground (ground line Vss) at the time of simultaneous switching of a plurality of signal lines can be reduced.

Second, the operation speed can be increased.

Furthermore, the number of leads of the ground (power source Vss) can be reduced.

What is claimed is:

1. A semiconductor integrated circuit device comprising:
   a semiconductor pellet having a main surface and a rear surface opposite said main surface, a plurality of electrode pads formed on said main surface;
   an insulating multi-layered substrate comprising a first conductive layer, a second conductive layer, a plurality of signal conductive strips, and first and second insulating layers, said second insulating layer being stacked on said first insulating layer, said signal conductive strips being formed between said first and second insulating layers, said first insulating layer being stacked over said first conductive layer, and said second conductive layer being stacked on said second insulating layer, wherein said insulating multi-layered substrate is formed around said semiconductor pellet;
   a plurality of first and second conductive strips formed over said first conductive layer and on said first insulating layer, wherein said first conductive strips are electrically connected to said first conductive layer, wherein said second conductive layer is for supplying a first reference potential to said semiconductor pellet and said first conductive layer is for supplying a second reference potential to said semiconductor pellet;
   first bonding wires, second bonding wires and third bonding wires, each of said first bonding wires being electrically connected to one of said electrode pads and one of said first conductive strips, each of said second wires being electrically connected to one of said electrode pads and to one of said second conductive strips, and each of said third bonding wires being electrically connected to one of said electrode pads and to said signal conductive strips;
   a plurality fourth bonding wires, each electrically connected to said second conductive layer and one of said second conductive strips;
   a plurality of external extension leads electrically connected to said signal conductive strips; and
   a resin molding body in which said semiconductor pellet, said multi-layered substrate, said wires and a part of each of said external extension leads are molded.

2. A semiconductor integrated circuit device according to claim 1, wherein said first conductive layer includes a side plate formed on a side surface of said first insulating layer which faces to a side surface formed between said main and said rear surfaces of said pellet, said side plate being unitarily formed with said first conductive strips.

3. A semiconductor integrated circuit device according to claim 1, wherein said second conductive layer is a power source potential supplying layer.

4. A semiconductor integrated circuit device according to claim 1, wherein said first conductive layer is a ground potential supplying layer.

5. A semiconductor integrated circuit device according to claim 1, further comprising:
   a through-hole formed in said second insulating layer, a conductive material formed in said through-hole, said conductive material being electrically connected to said second conductive layer and one of said second conductive strips.

6. A semiconductor integrated circuit device according to claim 1, wherein said signal conductive strips provide bidirectional current paths.

7. A semiconductor integrated circuit device according to claim 1, wherein at least one of said second conductive strips is electrically connected to said second conductive layer with two of said fourth bonding wires.

8. A semiconductor integrated circuit device according to claim 1, wherein at least one of said second conductive strips is electrically connected to one of said electrode pads with two of said third bonding wires.

* * * * *